(12) United States Patent
Muchherla et al.

(10) Patent No.: US 11,709,727 B2
(45) Date of Patent: Jul. 25, 2023

(54) MANAGING ERROR-HANDLING FLOWS IN MEMORY DEVICES

(71) Applicant: Micron Technology, Inc., Boise, ID (US)

(72) Inventors: Kishore Kumar Muchherla, Fremont, CA (US); Shane Nowell, Boise, ID (US); Mustafa N. Kaynak, San Diego, CA (US); Sampath K. Ratnam, Boise, ID (US); Peter Feeley, Boise, ID (US); Sivagnanam Parthasarathy, Carlsbad, CA (US); Devin M. Batutis, San Jose, CA (US); Xiangang Luo, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 17/216,901

(22) Filed: Mar. 30, 2021

(65) Prior Publication Data

US 2022/0318086 A1  Oct. 6, 2022

(51) Int. Cl.
*G06F 11/00* (2006.01)
*G06F 11/07* (2006.01)

(52) U.S. Cl.
CPC ...... *G06F 11/0793* (2013.01); *G06F 11/0727* (2013.01); *G06F 11/0751* (2013.01)

(58) Field of Classification Search
CPC ............. G06F 11/0793; G06F 11/0751; G06F 11/0727; G06F 11/079
See application file for complete search history.

(56) References Cited

U.S. PATENT DOCUMENTS

| | | | |
|---|---|---|---|
| 11,175,979 B2* | 11/2021 | Rayaprolu | ............ G06F 11/073 |
| 11,314,425 B2* | 4/2022 | Luo | ........................ G06F 3/0653 |
| 2019/0107972 A1 | 4/2019 | Lee | |
| 2019/0278653 A1 | 9/2019 | Padilla, Jr | |
| 2021/0304837 A1* | 9/2021 | Kim | ................. G11C 29/12005 |

FOREIGN PATENT DOCUMENTS

| | | |
|---|---|---|
| CN | 111863097 A | 10/2020 |
| EP | 3503107 A1 | 6/2019 |

* cited by examiner

*Primary Examiner* — Katherine Lin
(74) *Attorney, Agent, or Firm* — Lowenstein Sandler LLP

(57) ABSTRACT

Systems and methods are disclosed including a memory device and a processing device operatively coupled to the memory device. The processing device can perform operations including detecting a read error with respect to data residing in a block of the memory device, wherein the block is associated with a voltage offset bin, determining an ordered set of error-handling operations to be performed to the data, determining a most recently performed error-handling operation associated with the voltage offset bin; adjusting an order of the set of error-handling operations by positioning the most recently performed error-handling operation within a predetermined position in the order of the set of error-handling operations; and performing one or more error-handling operations of the set of error-handling operations in the adjusted order until data associated to the read error is recovered.

19 Claims, 6 Drawing Sheets

| ERROR-HANDLING METADATA TABLE 410 | |
|---|---|
| Bin | Error Handling Flow |
| 0 | $F_0$ |
| 1 | $F_1$ |
| 2 | $F_2$ |
| 3 | $F_3$ |
| 4 | $F_4$ |
| 5 | $F_5$ |
| ... | ... |

ERROR-HANDLING METADATA TABLE 420

| Error Handling Flow | Order of Operations | OP1 Parameters | OP2 Parameters | OP3 Parameters | EH_Last Operation | EH_Last Position |
|---|---|---|---|---|---|---|
| $F_0$ | OP1, OP2, OP3 | $P_{F0-OP1}$ | $P_{F0-OP2}$ | $P_{F0-OP2}$ | OP2 | First |
| $F_1$ | OP2, OP1, OP3 | $P_{F1-OP1}$ | $P_{F1-OP2}$ | $P_{F1-OP2}$ | OP3 | Second |
| $F_2$ | OP2, OP1, OP3 | | | | ... | ... |
| $F_3$ | OP2, OP3, OP1 | | | | ... | ... |
| $F_4$ | OP3, OP1, OP2 | | | | ... | ... |
| $F_5$ | OP3, OP2, OP1 | $P_{F5-OP1}$ | $P_{F5-OP2}$ | $P_{F5-OP2}$ | OP2 | First |
| ... | ... | | | | ... | ... |

FIG. 4

MANAGING ERROR-HANDLING FLOWS IN MEMORY DEVICES

TECHNICAL FIELD

Embodiments of the disclosure relate generally to memory sub-systems, and more specifically, relate to the managing error-handling flows in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 illustrates example metadata maintained by the memory sub-system controller, in accordance with aspects of the present disclosure.

DETAILED DESCRIPTION

Figure 1:
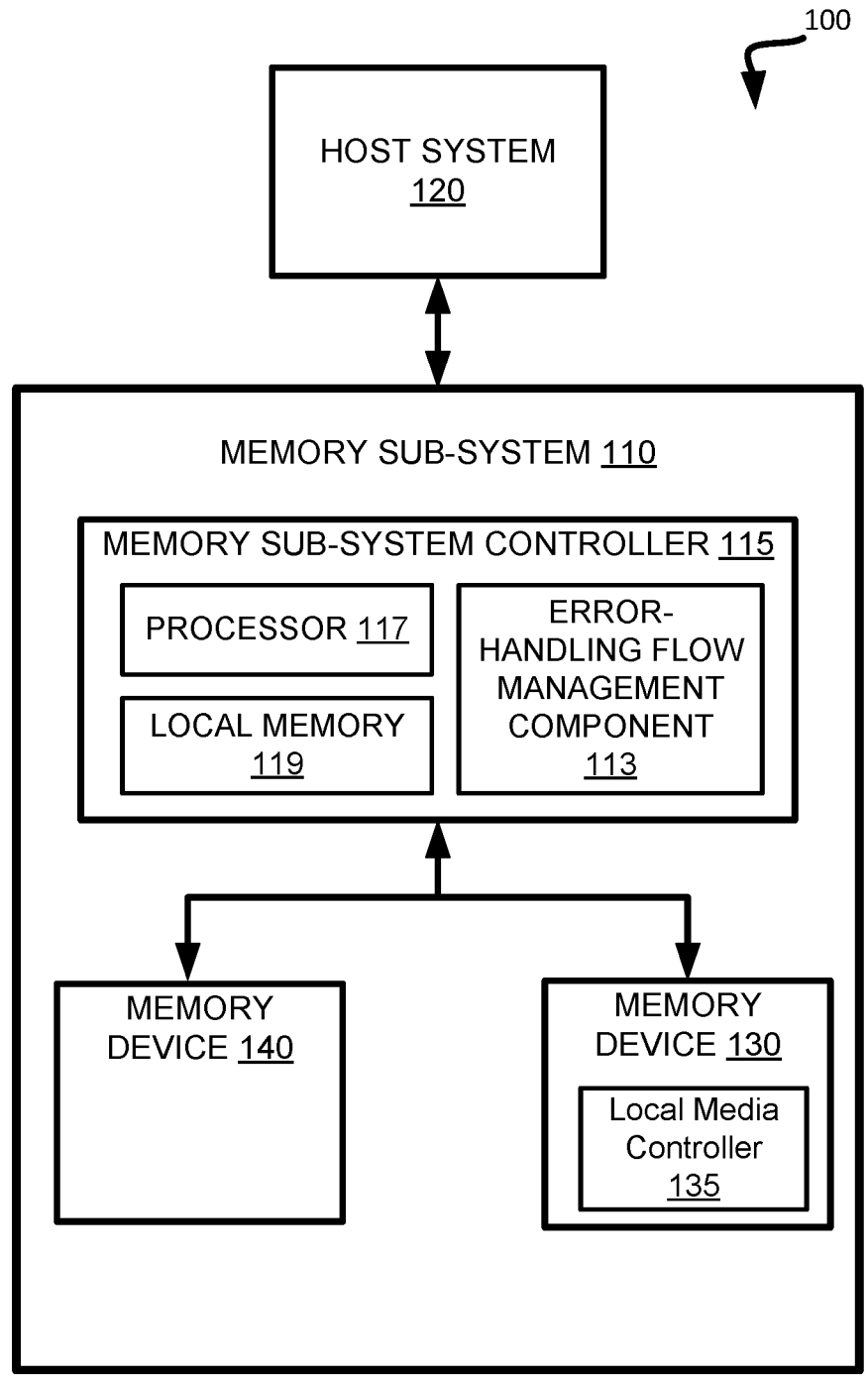
FIG. 1 illustrates an example computing system that includes a memory sub-system in accordance with some embodiments of the present disclosure.

Aspects of the present disclosure are directed to managing error-handling flows in memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error-handling data (e.g., error correction code (ECC) codeword parity data), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, which is called as the "threshold voltage" and denoted as Vt.

A memory device can have distributions that are narrow compared with the working range of control voltages tolerated by the cells of the device. Accordingly, multiple distributions (with "valleys" between distributions) can be fit into the working voltage window allowing storing and reliably detecting multiple bits per cell such as $2^3=8$ distributions (7 valleys) for TLC, $2^2=4$ distributions (3 valleys) for MLC etc. The distributions are interspersed with voltage intervals ("valley margins") between distributions where none (or very few) of the memory cells of the device have their threshold voltages. Therefore, such valley margins can be used to separate various charge states—the logical state of the cell can be determined by detecting, during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N-1$ read voltages are applied to distinguish $2^N$ distributions. Specifically, the read operation can be performed by comparing the measured threshold voltage $V_T$ exhibited by the memory cell to one or more reference voltage levels corresponding to known valleys (e.g., centers of the valleys) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed)

while slowing down at larger times in an approximately log-linear or power-law fashion ($\Delta V_T(t) = -C^* t^b$) with respect to the time t elapsed since the cell programming event. In some embodiments of the present disclosure, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \rightarrow V_T + \Delta V_T$ where $\Delta VT$ is negative due to charge loss. Whereas TVS is a continuous process and the compensating for $\Delta V_T(t)$ can be a continuous function of time, adequate accuracy of offsets can be achieved in some embodiments with a discrete number of offset "bins." Blocks can be associated with a bin using metadata (e.g., programmed within a specified time window and under similar environmental (e.g., temperature) conditions). Since the time elapsed since programming and temperature conditions are among the main factors affecting the amount of TVS, blocks associated with the same bin can be presumed to exhibit similar distributions of threshold voltages of their memory cells, and thus would require the same voltage offsets to be applied to the base read levels for read operations The memory sub-system controller can periodically perform a calibration process in order to associate blocks with one of the bins. Each bin, in turn, can be associated with a set of the voltage offsets to be applied for read operations. The associations of blocks with bins is referred herein as auxiliary read metadata (ARM), which represent a part of broader state metrics of the memory device. The state metrics can also reflect the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions that are grouped into families. Each family can include one or more blocks that have been programmed within a specified time window and/or a specified temperature window. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can identify the family associated with the memory partition identified by the logical address specified in the read command and identify the current bin associated with the identified family. The memory sub-system controller can then determine a set of read offsets for the identified bin and compute the new read voltages by additively applying the read offsets associated with the identified bin to the base read levels. The memory sub-system controller can then perform the read operation using the new read voltage(s), as described in more detail below.

"Read error" refers to a memory sub-system's failure to validate one or more data items that have been retrieved from a memory device in response to a read command. Read errors can be associated with host-initiated read operations or system-initiated scanning operations and can occur due to, for example, the measured threshold voltage $V_T$ exhibited by the memory cell mismatching the read voltage levels due to TVS, the requested data being subjected to noise or interference, etc. In a read error, the bit errors in the read data is greater than what the underlying ECC can correct and this results in an ECC failure and accordingly read error. In response to a read error, the memory sub-system can perform an error-handling flow in an attempt to recover the data. The error-handling flow can include one or more error-handling operations with respect to the data items that have been retrieved from the memory device. An error handling operation can include one or more read retries using different parameters, such as a change in read voltage, as compared to the initial read operation performed on the memory cell. The error-handling operation can also include "deep error handling techniques," such as forward error correction (FEC) with various versions of reliability information, hybrid automatic repeat request (HARQ), etc.

In some implementations, the memory sub-system controller can use a default (e.g., static) error-handling flow, in which the order of the error-handling operations performed during an error-handling flow remains the same for all blocks of the memory device. For example, upon entering the error-handling flow, the memory sub-system controller can first perform a set of relatively low latency operations, such as a predetermined amount read retries using varying, relatively small (e.g., not exceeding a predefined threshold) read offsets applied to the base read level. Responsive to the low latency steps successfully recovering the data, the memory sub-system controller can exit the error-handing flow to resume read and write operations. Responsive to the low latency steps failing to recover the data, the memory sub-system controller can perform the next error-handling operations specified in the error-handling flow. For example, the memory sub-system controller can perform higher latency steps, such as applying larger read offsets as compared to the read offsets used in the low latency steps, or using deep error-handling techniques (e.g., FEC, HARQ, etc.) to recover the data.

In some implementations, in response to sudden systematic changes to the memory sub-system, the memory sub-system controller can adjust the order of the error-handling operations performed during an error-handling flow by the implementing an error-handling last technique. A systematic change includes parameter change that occurs throughout the memory sub-system, such as a sudden change in operating temperature (e.g., operating temperature rises 20 degrees ° C. over a period of a few seconds), the memory sub-system powering up from an extended power-off period, etc. The error-handling last technique can include performing the last successful error handling-operation of an error-handling flow as the first error-handling operation in response to a new read error.

However, error-handling operations can be time consuming and impact performance of the memory sub-system, and can result in increased read times and/or degraded performance as observed by the host system. Therefore, due to TVS, implementing the error-handling last technique for all blocks, regardless of their associated bins, can increase the latency of error-handling flows performed by the memory sub-system. This is because, due to the different read offsets associated with different bins, performing an error-handling operation that successfully recovered data for a block assigned to one bin can be ineffective for a block assigned to a different bin.

Aspects of the present disclosure improve the efficiency of error-handling operations by implementing a memory sub-system controller capable of adjusting, based on an error-handling last operation, the order of error-handling operations in error-handling flows in memory devices. In particular, the memory sub-system controller can implement different error-handling flows for different bins and maintain an indication of the error-handling last operation performed for each of the bins and/or each of the error-handling flows. The error-handling last operation can be an error-handling operation preformed during a previous error-handling flow that successfully recovered data. The memory sub-system controller can maintain, in a metadata table, an indication of the error-handling last operation for each bin and/or each error-handling flow. Additionally, the memory sub-system controller can maintain an indication of the position, within the order of error-handling operations of each error-handling flow, of where the respective error-handling last operation is to be performed during a subsequent error-handling flow for each bin. Specifically, the error-handling last position can indicate to the memory sub-system controller to perform the error-handling last operation as the first error-handling operation in the subsequent error-handling flow for a particular bin, as the second error-handling operation in the subsequent error-handling flow for the particular bin, and so forth. Thus, based on the error-handling last operation and error-handling last position, the memory sub-system controller can adjust, for each bin, the order of operations of the respective error-handling flow to perform the error-handling last operation at the indicated error-handling last position.

In an illustrative example, in response to a read error on a block associated with a specific bin, the default error-handling flow for the bin can instruct the memory sub-system controller to perform error-handling operation 1, then error-handling operation 2, and then error-handling operation 3. In response to performing error-handling operation 2, the memory sub-system controller can successfully recover data related to the read error. The memory sub-system controller can then register, in a metadata table, error-handling operation 2 as the last successful error handling operation. In response to another read error, the memory sub-system controller can look up, in the metadata table, the error-handling last operation (i.e., error-handling operation 2), and the error-handling last position for the bin (e.g., first position). The memory sub-system controller can then perform error-handling operation 2 as the first error-handling operation in a subsequent error-handling flow for the bin.

Advantages of the present disclosure include, but are not limited to, an improved performance of the memory sub-system by decreasing the latency of error-handling flows performed by the memory sub-system. This can result in an improvement of performance of the memory sub-system and a decrease in power consumption by the memory sub-system. Furthermore, this can increase the lifespan of the memory sub-system. Although embodiments are described using memory cells of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

Figure 2:
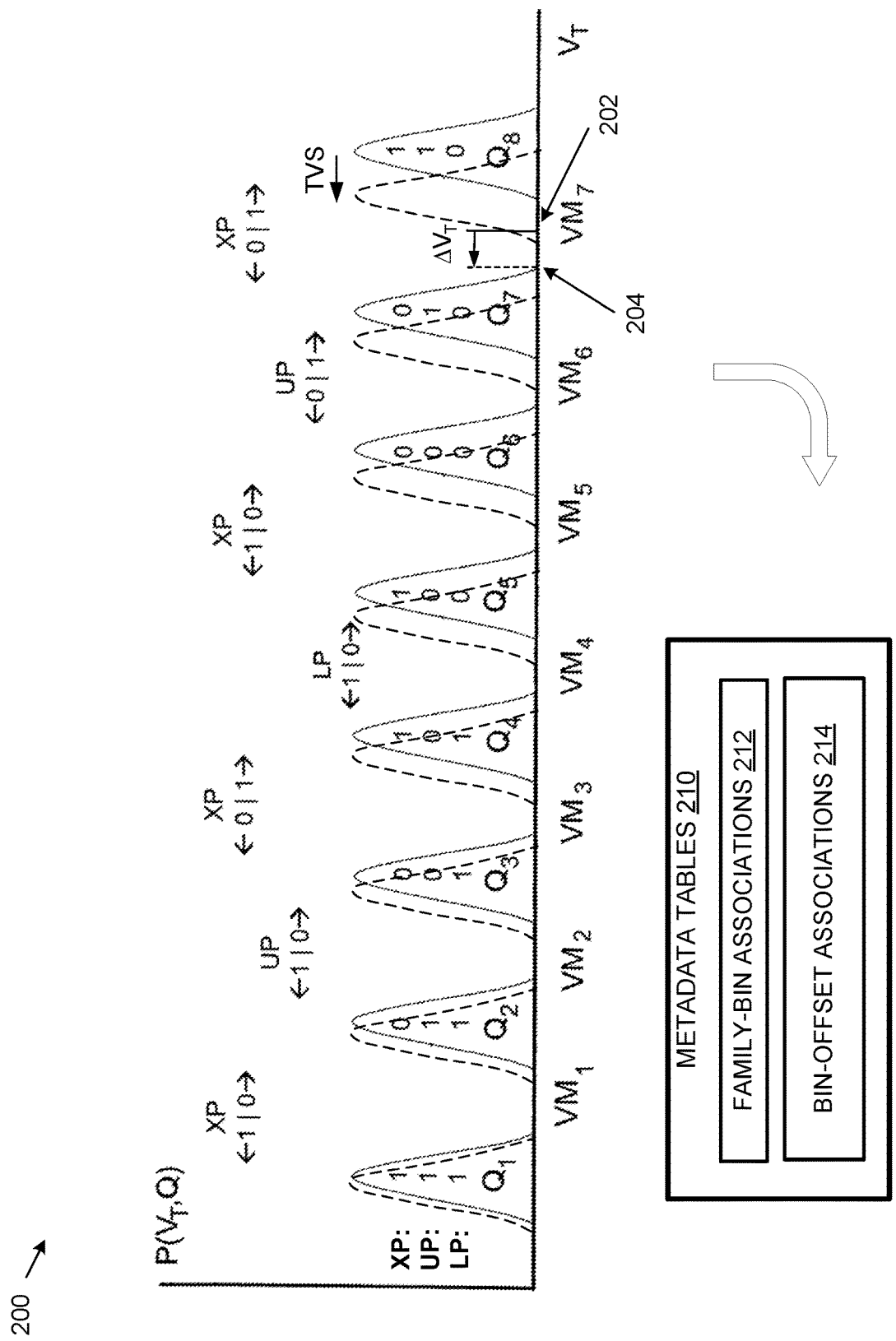
FIG. 2 illustrates schematically temporal voltage shift of a three-level memory cell capable of storing three bits of data by programming the memory cell into eight charge states that differ by the amount of charge on the cell's floating gate, in accordance with some embodiments of the present disclosure.

The memory sub-system 110 includes an error-handling flow management component 113 that can be used to implement the error handling strategies in accordance with embodiments of the present disclosure. In some embodiments, the memory sub-system controller 115 includes at least a portion of the error-handling flow management component 113. For example, the memory sub-system controller 115 can include a processor 117 (processing device) configured to execute instructions stored in local memory 119 for performing the operations described herein. In some embodiments, the error-handling flow management component 113 is part of the host system 120, an application, or an operating system. The error-handling flow management component 113 can manage block families associated with the memory devices 130, as described in more detail herein below FIG. 2 illustrates schematically temporal voltage shift (TVS) of a three-level memory cell (TLC) capable of storing three bits of data by programming the memory cell into eight charge states $Q_k$ (also called levels) that differ by the amount of charge on the cell's storage gate, in accordance with some embodiments of the present disclosure. The distributions of threshold voltages $P(V_T, Q_k)$ are separated with 7 valley margins $VM_n$. The cell programmed into k-th charge state $(Q_k)$ can store a particular combination of 3 bits. For example, the charge state $Q_k$ can store the binary combination 101, as depicted. Other mapping of Qk to 3 bits can be used as well. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 2 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). As an example, FIG. 2 shows a scenario where 3 bits are programmed in 3 passes. Other programming sequences such as 1-pass and 2-pass programming can be used as well. For the example shown in FIG. 2, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or error-handling flow management component 113) can, therefore, adjust the base read levels with the corresponding offsets $V_R \rightarrow V_R + \Delta V$ (where $\Delta V$ is usually less than zero), which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete set of voltage offsets $\Delta V$. In such embodiments, TVS phenomenon can be addressed with setting up a number of discrete bins, e.g., five, eight, twenty, etc., associated with various memory partitions. As an example, assume that for valley 7 the optimal read position is expected to shift 500 milli-volts. For the case of 6 bins, one can define offsets for valley-7 to be equally spaced such as 0 mV, NmV, 2 NmV, 3 NmV, 4 NmV, 5 NmV. Similarly, offsets for other valleys can be defined. Bin offsets can be defined to be not equally spaced but following a different spacing as well. The bin-related data can be stored in the metadata tables 210. The associations of various memory partitions (grouped into families, as described in more detail below) with bins can be stored in family-bin associations 212; the family-bin associations can dynamically change with the passage of time. For example, as the memory cells continue to lose charge with time, temperature and program/erase cycles (PEC), the respective memory partitions (grouped into families) can be moved, in a consecutive fashion, from junior bins to more senior bins having larger voltage offsets in magnitude. Bin-offset associations 214 can also be stored in the metadata tables 210. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the metadata tables 210, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partition-bin associations can be based upon calibration of the memory device (or similar types of memory devices, e.g., during design and manufacturing) for maximizing performance and minimizing read errors during read operations The threshold voltage offset depends on the time after program (TAP). TAP is the time since a cell has been written and is the primary driver of TVS. TAP may be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement may be made (e.g., perform reference calibration from 8 to 12 minutes after program). A time slice may be referenced by its center point (e.g., 10 minutes).

Blocks of the memory device can be grouped into block families, such that each block family includes one or more blocks that have been programmed within a specified time window and possibly a specified temperature window. As noted herein above, since the time elapsed after programming and temperature are the main factors affecting the temporal voltage shift, all blocks and/or partitions within a single block family are presumed to exhibit similar distributions of threshold voltages in memory cells, and thus would require the same voltage offsets for read operations. TVS also depends on program erase cycle, however with wear-leveling all blocks will have similar PEC and hence PEC will not be a differentiating factor of TVS among blocks within a block family.

Block families can be created asynchronously with respect to block programming events. In an illustrative example, the memory sub-system controller 115 of FIG. 1 can create ("open") a new block family whenever a specified period of time Δt (e.g., a predetermined number of minutes) has elapsed since creation of the last block family or whenever the reference temperature of memory cells, which is updated at specified time intervals, has changed by more than a specified threshold temperature ΔΘ since creation of the current block family. Similarly, the family can be "closed" (and a new family can be created) after the time Δt has elapsed since the family was created or if the reference temperature has changed (in either direction) by more than ΔΘ. The memory sub-system controller 115 can maintain an identifier of the active block family, which is associated with one or more blocks as they are being programmed A newly created block family can be associated with bin 0. Then, the memory sub-system controller can periodically perform a calibration process in order to associate each die of every block family with one of the predefines threshold voltage offset bins (bins 0-9 in the illustrative example of FIG. 3 for a single valley where as we go down on y-axis the offsets become more negative such as offset for bin-9 will have higher magnitude compared to bin-2 and both offsets will be negative), which is in turn associated with the voltage offset to be applied for read operations. The associations of blocks with block families and block families and dies with threshold voltage offset bins can be stored in respective metadata tables maintained by the memory sub-system controller.

The voltage distributions change in time due to the slow charge loss (SCL), which results in drifting values of the threshold voltage levels. In various embodiments of the present disclosure, the temporal voltage shift is selectively tracked for programmed blocks grouped by block families, and appropriate voltage offsets, which are based on block affiliation with a certain block family, are applied to the base read levels in order to perform read operations.

Figure 3:
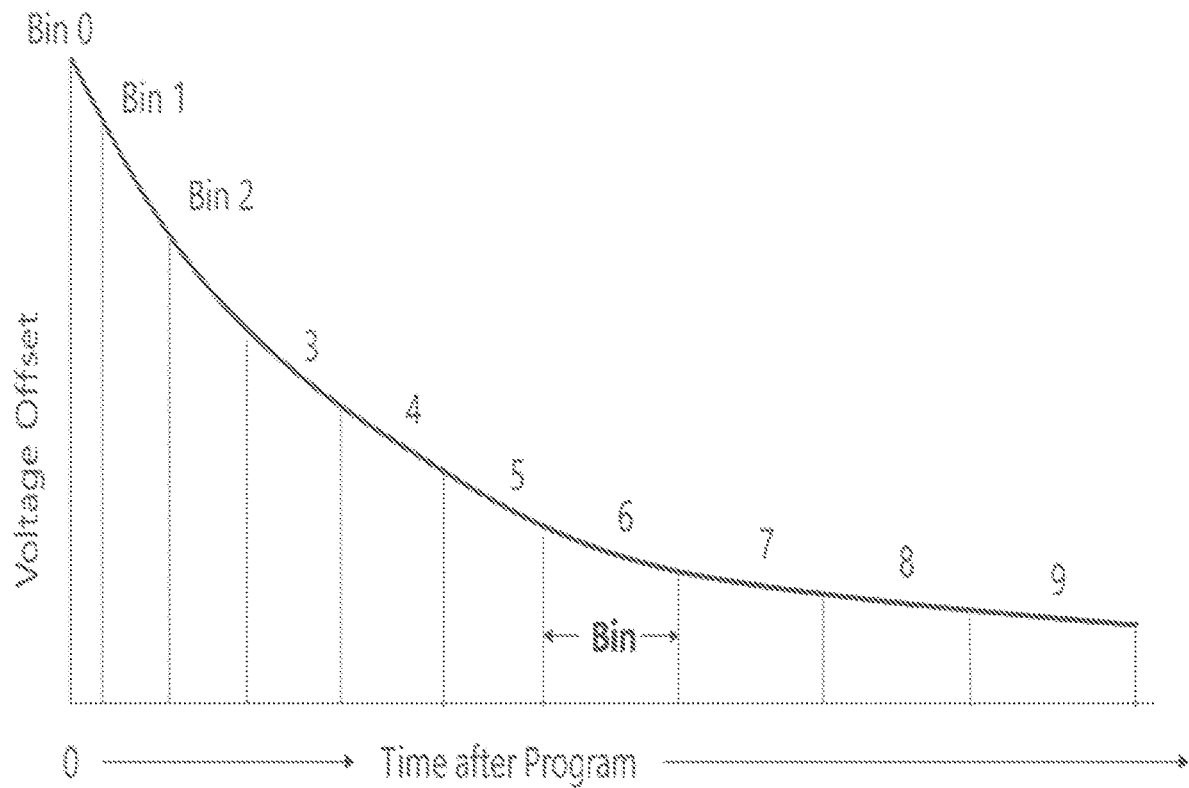
FIG. 3 depicts an example graph illustrating the dependency of the threshold voltage offset on the time after program (i.e., the period of time elapsed since the block had been programmed), in accordance with some embodiments of the present disclosure.

FIG. 3 schematically illustrates a set of predefined threshold voltage offset bins (bin 0 to bin 9) for a specific valley, in accordance with embodiments of the present disclosure. As schematically illustrated by FIG. 3, the threshold voltage offset graph 300 can be subdivided into multiple threshold voltage offset bins, such that each bin corresponds to a predetermined range of threshold voltage offsets. While the illustrative example of FIG. 3 defines ten bins (0-9), in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

FIG. 4 schematically illustrates example metadata maintained by the memory sub-system controller, in accordance with aspects of the present disclosure. In some embodiments, error-handling flow management component 113 can maintain an error-handling metadata table 410 and error-handling metadata table 420. In some embodiments, error-handling metadata tables 410 and 420 can be stored in memory of the memory sub-system (e.g., at memory device 130, 140, local memory 119, etc.) and can be referenced by error-handling flow management component 113 to determine an error-handling flow associated with a particular offset bin. Error-handling metadata tables 410 and 420 can be two separate metadata tables, or combined into a single metadata table As illustrated by error-handling metadata table 410, each bin can be associated with a respective error-handling flow (e.g., $F_0$, $F_1$ . . . $F_5$). As illustrated by error-handling metadata table 420, each error-handling flow can be associated with a particular set of error-handling operations to be performed in a particular order (e.g., order of operations), parameter values (such as read level adjustment values) for each error-handling operation per error-handling flow (e.g., OP1 parameters, OP2 parameters, OP3 parameters, etc.), an indication of the error-handling last operation performed), and the position within the order of operations of where the error-handling last operation is to be performed during a subsequent error-handling flow. The error-handling last operation can be an the error-handling operation performed during the previous error-handling flow that successfully recovered data Bins associated with younger blocks families (i.e., most recently created block families which experience larger TVS due to the log-linear nature of SCL where charge loss is faster with time right after programming vs later times) can be associated with error-handling flows where error-handling operations include relatively large read level adjustments (e.g., applying read offsets greater than a predetermined threshold value to the base read level). This is because the blocks in younger block families (e.g., block families in bins 0-3 in FIG. 3) can experience a larger shift with time in the threshold voltage (e.g., the threshold voltage changes rapidly immediately after the memory cell is programmed) than blocks in older block families (e.g., block families in bins 6-9 in FIG. 3). As such, by executing relatively broad read level adjustments that exceed a threshold criterion, the error-handling flow management component 113 can increase the chance of the read level adjustment successful recovering data using the initial error-handling operation of the error-handling flow. Accordingly, in some embodiments, each bin can be assigned a different set of error-handling operations to be performed in a predetermine order. For example, relatively older bins (e.g., bins having a relatively large TVS, such as bins 6-9 in FIG. 3) can be assigned with an error-handling flow where the error-handling operations includes the error-handling flow management component 113 first executing low latency error handling steps. In response to the low latency error handling steps failing to recover the desired data, the error-handling flow management component 113 can then execute deep error-handling techniques which have higher latency as well as higher success rate such as HARQ and/or FEC with reliability (soft) information. In other embodiments, error-handling operations and/or the order of the error-handling operations of an error-handling flow can be same for each bin.

The error-handling flow management component 113 can perform the error-handling operations of the error-handling flow associated with the bin to the blocks of block families associated with the same bin. In some embodiments, the associations of bins to respective error handling flows can be determined and set during manufacturing of the memory sub-system 110 or during programming and/or calibration of the memory sub-system 110. As such, each bin can be associated with an error-handling flow having a particular set of error-handling operations to be performed in a particular order.

In some embodiments, the error-handling flows of each bin can be adjusted by the memory sub-system controller 115 by re-ordering the error-handling flow such that the error-handling last operation of each respective bin is moved to a pre-determined position within order of operations of the default error-handling flow. The pre-determined position can be set during programming and/or calibration of the memory sub-system 110. The default error-handling flow can refer to an error-handling flow set for each block of the memory-subsystem during programming and/or calibration of the memory sub-system 110, and/or to the error-handling flow (e.g., $F_0$, $F_1$ ... $F_5$) initially associated with each bin. For example, the default error-handling flow for error-handling flow $F_0$ can include performing error-handling operation 1 (OP1), then error-handling operation 2 (OP2), and then error-handling operation 3 (OP3). The error-handling last operation of each most recent performed error-handling flow can be tracked by the error-handling flow management component 113 via metadata table 420 by maintaining a per-bin record of which error-handling operation successfully recovered data during the most recent performed error-handling flow. The adjustment of the order of the error-handling operations for a respective bin can be based on the error-handling last operation (error-handling operation that successfully recovered data during the most recent error-handling flow performed by the error-handling flow management component 113). In particular, the error-handling flow management component 113 can perform the error-handling last operation, during a subsequent error-handling flow, at the position within the order of operations as indicated by metadata table 420.

The error-handling last position can indicate to the error-handling flow management component 113 at which position, within the order of operations for a respective bin and during a subsequent error-handling flow assigned to said bin, to perform the error-handling last operation. The error-handling last position can be set during programming and/or calibration of the memory sub-system 110. In particular, each error-handling last position for each error-handling flow and/or bin can be selected and set during programming and/or calibration of the memory subs system 110. In some embodiments, the error-handling last position can be set to the first position in the error-handling flow. As such, the error-handling last operation can be performed first in the subsequent error-handling flow. In some embodiments, the error-handling last position can be set to the second position in the error-handling flow. For example, the first error-handling operation can include a read-retry operation, and the second error-handling operation can include the error-handling last operation. In other embodiments, the error-handling last position can be any position within the error-handling flow. For example, responsive to the error-handling last position indicating that the error-handling last operation is to be performed second during a subsequent error-handling flow, the error-handling flow management component 113 can, during said subsequent error-handling flow, perform the first error-handling operation of the error-handling flow, then the error-handling last operation in response to the first error-handling operation failing to recover data, and then the remainder of the error-handling operations of the error-handling flow until data is successfully recovered. In some embodiments, rather than looking up the error-handling last position in a metadata table, the error-handling flow management component 113 can perform the error-handling last operation first in a subsequent error-handling flow. In particular, during each error-handling flow, error-handling flow management component 113 can determine the error-handling last operation, perform the error-handling last operation as the first error-handling operation of the error-handling flow, and, responsive to the error-handling last operation failing to recover data, perform the remaining error-handling operations of the error-handling flow until the data is recovered.

In an illustrative example, in response to a read error on a block associated with a bin (e.g., bin 0 ($F_0$)), the default error-handling flow for bin 0 can instruct the error-handling flow management component 113 to perform error-handling operation 1, then error-handling operation 2, and then error-handling operation 3. In response to performing error-handling operation 2, the error-handling flow management component 113 can successfully recover data associated with the read error. The error-handling flow management component 113 can then register, in metadata table 420, error-handling operation 2 as the error-handling last operation. In response to another read error, error-handling flow management component 113 can look up, in metadata table 420, the error-handling last operation (i.e., error-handling operation 2), and the error-handling last position (e.g., first). The error-handling flow management component 113 can then perform error-handling operation 2 as the first operation in a subsequent error-handling flow.

Responsive to error-handling operation 2 being unsuccessful in recovering data, error-handling flow management component 113 can perform the remainder of the error-handling operations specified by the error-handling flow (e.g., error-handling operation 1, then error handling operation 3). In response to an error-handling operation recovering data, error-handling flow management component 113 can update metadata table 420 to indicate which error-handling operation successfully recovered the data. Responsive to the error-handling operation 2 successfully recovering data, error-handling flow management component 113 can terminate performing any further operations specified by the error-handling flow, and maintain error-handling operation 2 as the error-handling last operation in meta data table 420.

As discussed above, each error-handling flow (e.g., $F_0$, $F_1$ ... $F_5$) can include different error-handling operations to be executed in a predetermined order by the error-handling flow management component 113 until the desired data of a read operation is successfully recovered. Error-handling operations can include one or more read retries using different parameters, such as applying different read offsets to the base read level, deep error-handling techniques such as FEC and HARQ, etc. In some embodiments, one error-handling operation can include a first set of read retries that applying a set of read offsets to the base read level, and another error-handling operation can include a second set of read retries that applying a different set (having different values) of read offsets to the base read level. One or more error-handling operations in one error-handling flow may not be included in another error-handling flow, and vice versa. In some embodiments, multiple bins can be associated with the same error-handling flow.

Figure 5:
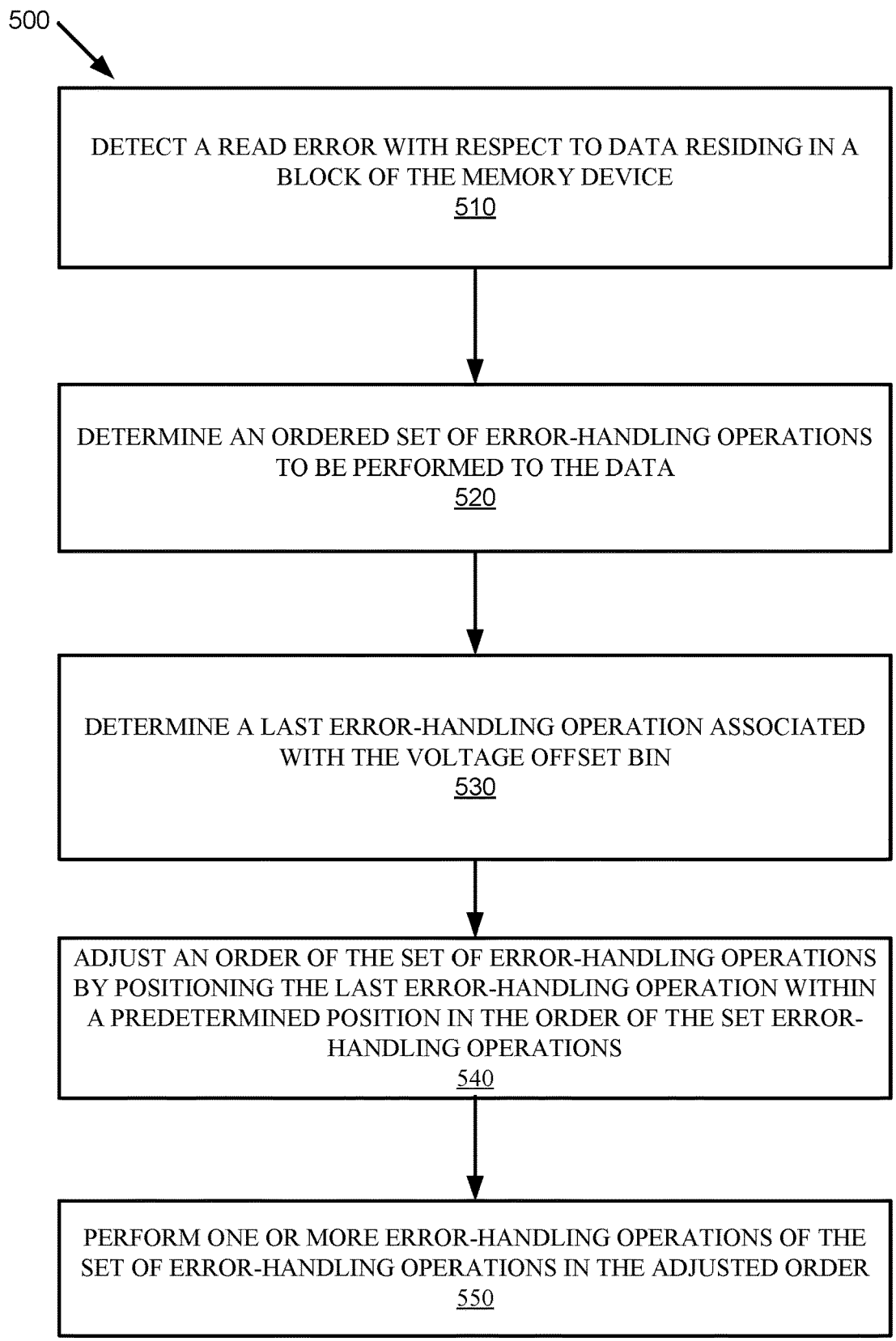
FIG. 5 is a flow diagram of an example method of performing error-handling flow management, in accordance with some embodiments of the present disclosure.

FIG. 5 is a flow diagram of an example method 500 of error-handling flow management implemented by a memory sub-system controller operating in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error-handling flow management component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 510, the processing logic detects a read error with respect to data residing in a block of the memory device. In some embodiments, the block can be part of a block family associated with a voltage offset bin.

At operation 520, the processing logic determines an ordered set of error-handling operations to be performed to recover data associated with the read error. For example, the processing logic can use a metadata table (e.g., metadata table 410 and/or 420) to determine which error-handling flow is associated with the voltage offset bin, and the order of the error-handling operations (along with their parameters) specified by the error-handling flow.

At operation 530, the processing logic determines an error-handling last operation associated with the voltage offset bin. The error-handling last operation can be an error-handling operation that successfully recovered data during the most recent error-handling flow performed by the processing logic on a block associated with the voltage offset bin (e.g., a most recently performed error-handling operation). An indication of the error-handling last operation can be maintained, by the processing logic, in a metadata table.

At operation 540, the processing logic adjusts the order of the set of error-handling operations by positioning the error-handling last operation within a predetermined position in the order of the set of error-handling operations. The predetermined position can indicate to the processing logic at which position, within the order of operations for a respective bin, to perform the error-handling last operation within the order of error-handling operations. An indication of the predetermined position can be maintained, by the processing logic, in a metadata table. The predetermined position can be set during at least one of programming or calibration of the memory device.

At operation 550, the processing logic performs one or more error-handling operations of the set of error-handling operations in the adjusted order until data associated with the read error is recovered. In response to an error-handling operation of the plurality of error-handling operations in the adjusted order recovering data associated with the read error, the processing logic can update the metadata table by replacing previous error-handling last operation with the current error-handling last operation.

Figure 6:
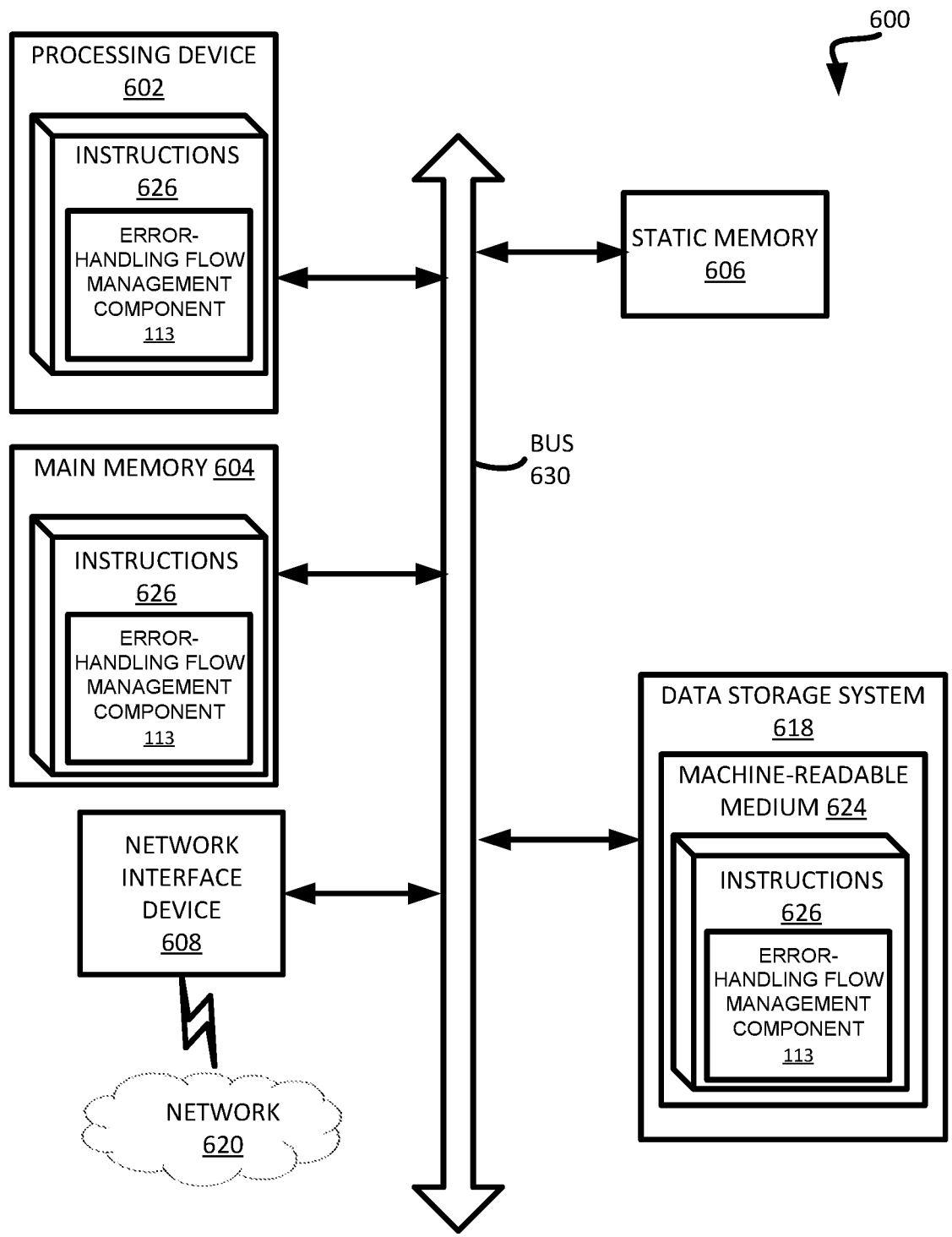
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to error-handling flow management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to error-handling flow management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled to the memory device, to perform operations comprising:
        detecting a read error with respect to data residing in a block of the memory device, wherein the block is associated with a voltage offset bin;
        determining an ordered set of error-handling operations to be performed to the data;
        determining a most recently performed error-handling operation associated with the voltage offset bin, wherein the most recently performed error-handling operation is an error-handling operation that has successfully recovered data associated with a previous read error that occurred to a block associated with the voltage offset bin;
        adjusting an order of the set of error-handling operations by positioning the most recently performed error-handling operation within a predetermined position in the order of the set of error-handling operations; and
        performing one or more error-handling operations of the set of error-handling operations in the adjusted order until data associated to the read error is recovered.

2. The system of claim 1, wherein the ordered set of error-handling operations is based on the voltage offset bin associated with the block.

3. The system of claim 1, wherein the processing device is to perform further operations comprising:
    maintaining, in a metadata table, a record indicating an error-handling operation that successfully recovered data.

4. The system of claim 1, wherein the processing device is to perform further operations comprising:
    maintaining, in a metadata table, an indication of a location of the predetermined position in the error-handling flow.

5. The system of claim 1, wherein the processing device is to perform further operations comprising:
    in response to an error-handling operation of the set of error-handling operations in the adjusted order recovering data associated with the read error, updating a metadata table by replacing the most recently performed error-handling operation with the error-handling operation.

6. The system of claim 1, wherein the predetermined position is set during at least one of programming or calibration of the memory device.

7. The system of claim 1, wherein the order is specified in a metadata table.

8. A method, comprising:
- detecting a read error with respect to data residing in a block of a memory device;
- determining, based on a voltage offset bin associated with the block, an ordered set of error-handling operations to be performed to the data;
- determining a most recently performed error-handling operation, wherein the most recently performed error-handling operation is an error-handling operation that has successfully recovered data associated with a previous read error; and
- performing the error-handling most recently performed operation as a first error-handing operation of the error-handling flow.

9. The method of claim 8, further comprising:
- maintaining, in a metadata table, a record indicating an error-handling operation that successfully recovered data.

10. The method of claim 8, further comprising:
- in response to an error-handling operation of the set of error-handling operations recovering data associated with the read error, updating a metadata table by replacing the most recently performed error-handling operation with the error-handling operation.

11. The method of claim 8, further comprising:
- maintaining, in a metadata table, an indication that the most recently performed error-handling operation is to be performed first in a subsequent error-handling flow.

12. The method of claim 8, wherein an order of the ordered set of error-handling operations is specified in a metadata table.

13. A non-transitory computer-readable storage medium comprising instructions that, when executed by a processing device operatively coupled to a memory, performs operations comprising:
- detecting a read error with respect to data residing in a block of a memory device, wherein the block is associated with a voltage offset bin;
- determining an ordered set of error-handling operations to be performed to the data,
- determining a most recently performed error-handling operation associated with the voltage offset bin, wherein the most recently performed error-handling operation is an error-handling operation that has successfully recovered data associated with a previous read error that occurred to a block associated with the voltage offset bin;
- adjusting an order of the set of error-handling operations by positioning the most recently performed error-handling operation within a predetermined position in the order of the set of error-handling operations; and
- performing one or more error-handling operations of the set of error-handling operations in the adjusted order until data associated to the read error is recovered.

14. The non-transitory computer-readable storage medium of claim 13, wherein the ordered set of error-handling operations is based on the voltage offset bin associated with the block.

15. The non-transitory computer-readable storage medium of claim 13, wherein the processing device to perform further operations comprising:
- maintaining, in a metadata table, a record indicating an error-handling operation that successfully recovered data.

16. The non-transitory computer-readable storage medium of claim 14, wherein the processing device to perform further operations comprising:
- maintaining, in a metadata table, an indication of a location of the predetermined position in the error-handling flow.

17. The non-transitory computer-readable storage medium of claim 13, wherein the processing device is to perform further operations comprising:
- in response to an error-handling operation of the set of error-handling operations in the adjusted order recovering data associated with the read error, updating a metadata table by replacing the most recently performed error-handling operation with the error-handling operation.

18. The non-transitory computer-readable storage medium of claim 13, wherein the predetermined position is set during at least one of programming or calibration of the memory device.

19. The non-transitory computer-readable storage medium of claim 13, wherein the order is specified in a metadata table.

* * * * *